US006868374B1

(12) United States Patent
Ditlow et al.

(10) Patent No.: US 6,868,374 B1
(45) Date of Patent: Mar. 15, 2005

(54) METHOD OF POWER DISTRIBUTION ANALYSIS FOR I/O CIRCUITS IN ASIC DESIGNS

(75) Inventors: Gary S. Ditlow, Garrison, NY (US); Robert A. Proctor, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 821 days.

(21) Appl. No.: 09/677,913

(22) Filed: Oct. 3, 2000

(51) Int. Cl.[7] ............................. G06F 17/50; G06G 7/54
(52) U.S. Cl. ............................... 703/18; 703/22; 716/4; 716/17
(58) Field of Search .................... 703/13–22; 716/1–10, 716/17–18

(56) References Cited

U.S. PATENT DOCUMENTS

| | | | |
|---|---|---|---|
| 5,404,310 A | 4/1995 | Mitsuhashi | 364/490 |
| 5,537,328 A | 7/1996 | Ito | 364/489 |
| 5,598,348 A | 1/1997 | Rusu et al. | 364/491 |
| 5,838,947 A | 11/1998 | Sarin | 395/500 |
| 5,872,952 A | 2/1999 | Tuan et al. | 395/500 |
| 5,883,814 A | 3/1999 | Luk et al. | 364/491 |
| 5,903,469 A | 5/1999 | Ho | 364/489 |
| 5,933,358 A | 8/1999 | Koh et al. | 364/578 |
| 6,225,143 B1 * | 5/2001 | Rao et al. | 438/106 |

OTHER PUBLICATIONS

Buffet et al, "Methodology for I/O Cell Placement and Checking in ASIC Designs Using Area–Array Power Grid," Proceedings of the IEEE 2000 Custom Integrated Circuits Conference, pp. 125–128 (May 2000).*

Hayashi et al, "EMI–Noise Analysis Under ASIC Design Environment," ACM Proceedings of the 1999 International Symposium on Physical Design, pp. 16–21 (Sep. 1999).*
Kar et al, "Optimizing C4 Bump Placements for a Peripheral I/O Design," 1999 IEEE Proceedings of the 49th Conference on Electric Components and Technology, pp. 250–254 (Jun. 1999).*
Caldwell et al, "Implications of Area–Array I/O for Row–Based Placement Methodology," 1998 IEEE Symposium on IC/Package Design Integration, pp. 93–98 (Feb. 1998).*
Farbarik et al, "Cad Tools for Area Distributed I/O Pad Packaging," 1997 IEEE Multi–Chip Module Conference, pp. 125–129 (Feb. 1997).*
Richard Goering; *Analysis Tool Touts Integration*, Electronic Engineering Times, Feb. 9, 1999, p. PG45.
Richard Goering; *Cadence Adds 'Integrity' Features to IC Layout*; Electronic Engineering Times, Nov. 8, 1999, p. PG63.

* cited by examiner

*Primary Examiner*—Samuel Broda
(74) *Attorney, Agent, or Firm*—Connolly, Bove, Lodge & Hutz LLP

(57) ABSTRACT

A method and system for testing the compliance of a distribution of I/O circuits in a semiconductor chip with voltage (IR) and electromigration (EM) limits. Maximum and average currents for the I/O circuits are calculated. A resistance model for the power distribution network of the chip is created, and the I/O circuit currents are indexed to corresponding nodes in the resistance model. Average current demand of the logic circuitry of the chip is also calculated and indexed to nodes in the resistance model. The resistance model with indexed currents is then solved to determine voltages at the nodes. The voltages are checked for compliance with IR and EM limits, and a report is produced. If violations of the IR and EM limits are detected, the placement of the I/O circuits in the power distribution network may be revised to bring the design into compliance with IR and EM requirements.

15 Claims, 7 Drawing Sheets

METHOD OF POWER DISTRIBUTION ANALYSIS FOR I/O CIRCUITS IN ASIC DESIGNS

CROSS REFERENCE TO RELATED APPLICATION

This application is related by common inventorship and subject matter to application Ser. No. 09/615,149, now U.S. Pat. No. 6,499,134 titled "Method of Assigning Intergrated Circuit I/O Signals in a Intergrated Circuit Package," issued 24 Dec. 2002. The listed application is assigned to International Business Machines Corporation and is entirely incorporated herein by this reference.

BACKGROUND OF THE INVENTION

The present invention relates to a method for establishing a distribution of I/O circuits in an application-specific integrated circuit (ASIC), and more particularly to a method for insuring that a distribution of I/O circuits complies with voltage drop (IR) and electro-migration (EM) requirements for the ASIC.

In an ASIC, a power grid comprising a plurality of power buses supplies current to logic circuitry and I/O circuits used to drive signals on and off a chip housing the ASIC. In determining a distribution of the I/O circuits, IR (current x resistance) drops and EM limits on the chip design must be taken into consideration. For example, if I/O circuits are clustered too densely within a given area, IR and EM limits of the chip may be exceeded, causing a logic or electrical failure.

Power buses that supply power to I/O circuits also provide power to the logic circuitry of the chip, and consequently, for best accuracy, currents of the logical circuitry should be included in an analysis of IR and EM behavior of the chip.

Existing methods of performing analysis of the distribution of I/O circuits in chip design have disadvantages. For example, power distribution analysis is typically performed late in the overall design process. Most existing approaches utilize an extraction process. The extraction process extracts shape data from the geometric pattern comprising the conducting lines in which current flows on a chip. The shape data is processed by extraction techniques to convert the shape data into a resistance matrix, which would then be solved. The extraction process is typically time-intensive and creates extremely large resistance models, which can take many hours or days to solve.

Moreover, existing methods tend to be overly localized. A designer may refer to guidelines, which recommend that circuits be placed in a certain density per unit area. However, such an approach fails to take into account the current requirements of the overall power distribution grid, and consequently can introduce inefficiencies in power distribution analysis. For example, guidelines that specify a maximum number of allowable I/O circuits within a specified area, but do not account for neighboring areas that maybe empty or occupied by low power circuits, thus demanding less current, typically force designers to adjust I/O circuits placement when a broader analysis may show that no placement changes are needed.

In view of the foregoing, a method for I/O circuit distribution analysis is needed which addresses the noted disadvantages of existing methods.

SUMMARY OF THE INVENTION

A method according to the present invention provides for an analysis of I/O circuit distribution which takes into account the overall power grid of an ASIC, and which may be performed early in the chip design process. The method results in improved accuracy of I/O circuit placement and a substantial reduction of the time required for analysis of I/O circuit placement as compared to existing methods.

In a preferred embodiment, the method comprises calculating currents corresponding to the I/O circuits of an ASIC, and generating a resistance model of a power distribution network for the ASIC. Using a distribution of the I/O circuits in terms of their assigned locations within the chip, each I/O circuit is indexed to the node closest to it in the resistance model. The average logic current demand per node is also calculated and indexed to the nodes.

The resulting resistance and current source model is then solved using a known solver. The solver outputs voltages of each node of the resistance/current model. The voltages are then checked against the design specifications to determine whether they are within IR and EM limitations. A report identifying those nodes which are not in compliance with requirements is produced and may be used to redistribute the I/O circuits in order to satisfy IR and EM limitations. The foregoing process may be performed iteratively to arrive at a distribution of I/O circuits which satisfies design requirements.

The above-described method allows a detailed analysis of IR and EM behavior of an I/O circuit distribution to be performed very early in the design cycle by requiring only minimum design-specific information, comprising an image definition of an ASIC with defined locations of I/O circuits and a known resistance model of a power distribution network for the ASIC. The analysis takes into account the entire power distribution network. Accordingly, problem areas can be identified early in the design process and solved using the above-described iterative approach. The method can also be applied in later stages of design, as more detailed information becomes available.

DETAILED DESCRIPTION OF THE INVENTION

Figure 1:
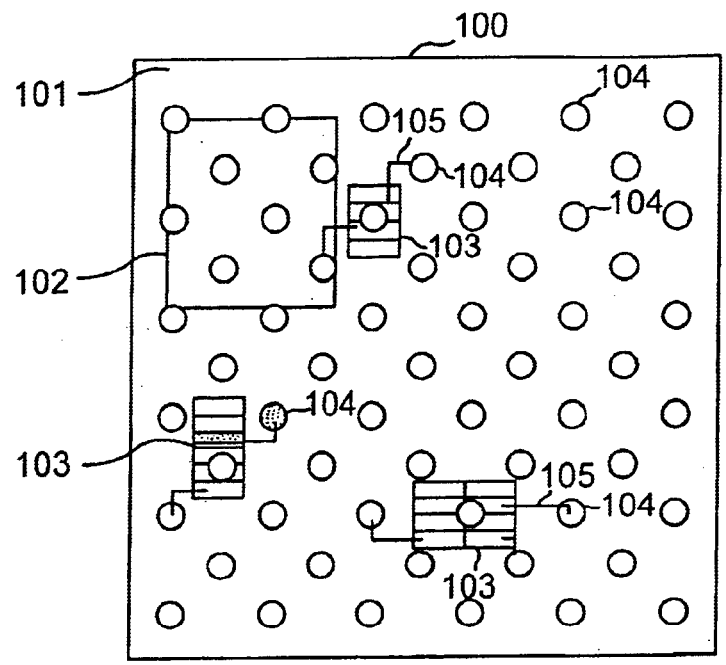
FIG. 1 shows an example of an area-array type of ASIC chip layout.
Figure 2:
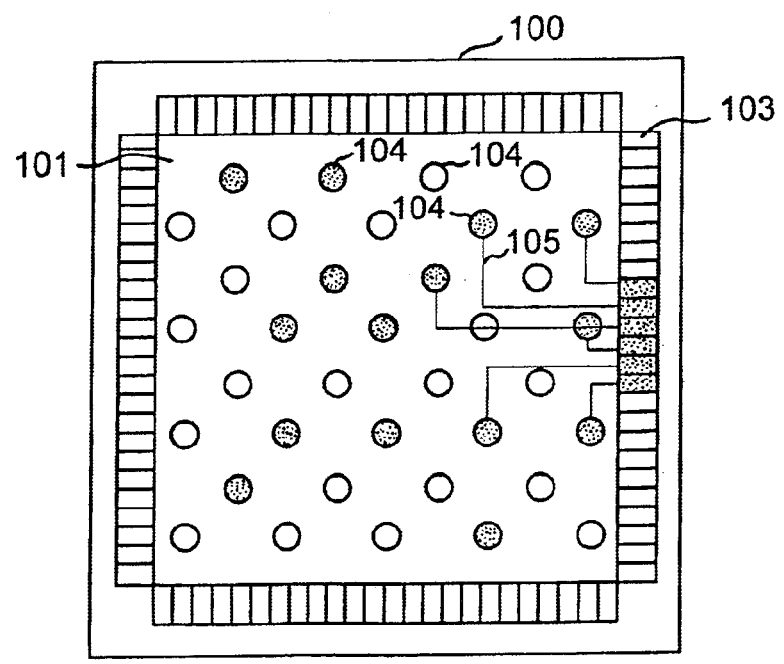
FIG. 2 shows an example of a peripheral type of ASIC chip layout.

FIGS. 1 and 2 show examples of types of ASIC chip layouts to which the method according to the present invention may be advantageously applied. FIG. 1 shows an example of an area-array type chip layout. A chip 100 includes a logic area 101 containing logic circuits. The chip may also contain macros 102, which are pre-defined areas of logic already placed and routed.

Multiple chip layers are illustrated in the same plane in FIG. 1. The logic circuits and macros would typically reside on a lower layer. I/O circuits 103 for carrying signals on and off the chip may be distributed across the logic area, anywhere within snap grids defined for the I/O circuits. The snap grids are typically aligned with the major horizontal and vertical power buses of the power distribution network for the chip. A routed connection 105 may exist between an I/O circuit 103 and an I/O pad 104. The I/O pads 104 typically occupy an upper metal layer of the chip. The routed connection 105 is made between routing layers of metallurgy M1 to M6. The I/O pads 104 illustrated in FIG. 1 are signal pads; no power pads are shown.

FIG. 2 shows an example of a peripheral type of chip layout. In a peripheral type of layout, I/O circuits 103 are peripheral to a logic area 101. Each I/O circuit 103 resides in an "I/O slot" electrically connected by a connection 105 to an I/O pad 104. In FIG. 2 multiple chip layers are illustrated in the same plane. The I/O pads 104 would typically occupy an upper metal layer of the chip. The I/O pads 104 illustrated in FIG. 2 are signal pads; no power pads are shown.

Figure 3:
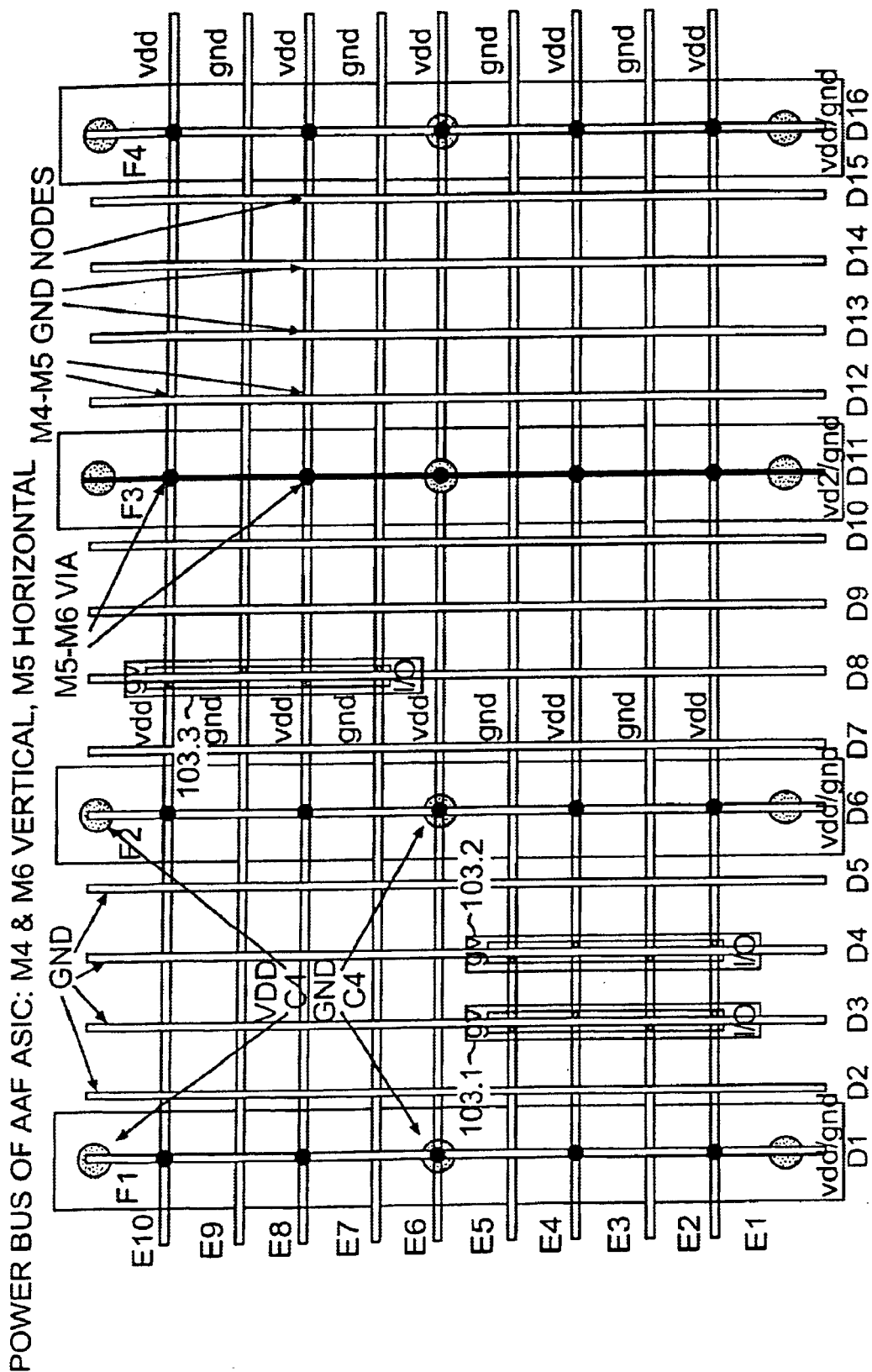
FIG. 3 shows an example of a portion of a power bus in a power distribution network for an area-array type chip layout, including example I/O circuit placements and connections.

Referring to FIG. 3, there is shown a portion of a power distribution network for the area-array type of chip layout illustrated in FIG. 1. The power distribution network would typically comprise a plurality of vertical and horizontal power buses. The arrangement of the power buses establishes a regular, repeating pattern for the power distribution network. Points along the power buses, including points where the vertical buses intersect the horizontal buses, may be defined as nodes of the power distribution network. Each node has a unique X,Y coordinate (where X and Y refer to orthogonal axes in a coordinate system for defining locations on the chip).

The portion of the power distribution network comprises horizontal conductors on a M5 metal layer, having alternating VDD and GND voltage levels, designated by reference characters E1 through E10. Vertical conductors on a M4 metal layer are designated D1–D16, and vertical conductors on a M6 metal layer are designated F1–F4. Also shown are power pad connections (VDD and GND "C4" pads), M5–M6 vias, and M4–M5 GND nodes.

Three I/O circuits 103.1–3 are shown. The I/O circuit designated 103.1 has a connection to the GND voltage level at E5-D3, a connection to the VDD voltage level at E4-D3, a connection to the GND voltage level at E3-D3, and a connection to the VDD voltage at E2-D3. The I/O circuit designated 103.2 has connections to the power distribution network at E5-D4 (GND), E4-D4 (VDD), E3-D4 (GND), and E2-D4 (VDD). The I/O circuit designated 103.3 has connections to the VDD voltage level at E10-D8 and E8-D8, and connections to the GND voltage level at E9-D8 and E7-D8.

According to the invention, a resistance model is created corresponding to the power distribution network for the area-array type chip layout as illustrated in FIGS. 1 and 3. A computer program taking as input information files describing technical details of the power distribution network may be executed to generate the resistance model, as described in greater detail below. The resistance model is defined in terms of the resistivity of the power buses at nodes of the buses. The resistivity may be calculated, for example, using a known sheet rho and a width of the bus.

Currents in the I/O circuits 103 connected to the buses are calculated and included in the resistance model. In including the I/O currents in the resistance model, a known X-Y location of the I/O circuit in the power distribution network is used to index, or logically relate, the currents for the I/O circuits with the node in the resistance model closest to the I/O circuit. An average logic current demand per node is calculated and indexed to the nodes.

The resistance model with corresponding I/O circuit currents is then solved by a commercially available solver to find voltages at the nodes. The output of the solver may comprise a file identifying each node and the voltage at that node, and a file describing each element of the resistance/current model, the voltage at each end of the element, and the current flowing through the element.

The output of the solver is compared against a specified allowable voltage distribution, to check whether the distribution of I/O circuits is within IR and EM restrictions. For example, a design rule may specify that no circuit may have a variation of greater than 5 percent of a voltage supplying the circuit. Using the known supply voltages of the chip, and the 5 percent allowable variation which can be calculated, IR compliance for the I/O circuit distribution can be determined. Similarly, using the currents through each element output by the solver, compliance with EM restrictions can be determined.

Typically, the output of the solver would be formatted into a human readable file that reports the voltages and currents and any violations of IR or EM limits. If the report showed violations of IR or EM limits, the distributions of I/O circuits would be rearranged, and again processed as described above to check for compliance with the IR and EM limits.

In the step of constructing the resistance model of the power distribution network, techniques may be applied for achieving greater processing efficiency. For example, a section of the network may represent a pattern that is repeated across the network, and therefore, the resistance model can be constructed by simply repeating the resistive elements of this section in a regular fashion to model the entire network.

Moreover, the resistance model may be expressed in different degrees of granularity. Typically, different levels of granularity would yield different X-Y locations for nodes of resistance model. For example, in a model of fine granularity, each I/O circuit would be closer to at least one node of the resistance model than would be the case, for the average I/O circuit, in a resistance model of coarse granularity. The degree of granularity utilized would depend upon the accuracy of the model needed in order to achieve acceptable results as determined by a user.

One example of a simplified resistance model that would permit greater processing efficiency while still achieving acceptable results is a resistance model in which the resistance values for the metal layers are lumped. The metal layers M1 through M6 comprise horizontal buses extending in the X direction across layers M1, M3 and M5, and vertical buses extending in the Y direction on layers M2, M4, and M6. Vias form layer-to-layer bus connections. In a simplified model for greater processing efficiency, resistance values of the M1 and M3 layers could be combined or lumped into the M5 layer, while the resistance values of the vertical M2 layer could be lumped into the vertical M4 layer. Such a lumped model could provide a suitable level of accuracy, while allowing for a greater processing speed in constructing and solving the resistance model.

The step of calculating the currents of the I/O circuits for incorporation into the resistance model includes two forms of analysis. One form is an IR, or voltage drop analysis. A second form of analysis calculates EM, or electromigration currents. IR analysis uses average currents for the logic circuitry and maximum currents for the I/O circuits. EM analysis uses average currents for the logic circuitry and average currents for the I/O circuits.

To calculate the maximum currents for the IR drop analysis, a file containing specifications for the I/O circuits may be utilized. The file would include such information as the impedance of the I/O circuits, the X-Y locations of the circuits, and the I/O pad to which the I/O circuit is connected. Typically, such specifications would differ depending upon the type of I/O circuit and chip technology. Using the I/O specifications for the I/O circuits, a maximum current utilized by each I/O circuit is calculated. Such maximum currents typically occur when an I/O circuit is driving a signal on or off a chip, which requires a significant amount of current. These high currents generate the IR drops which are of interest.

For calculating the average current demand of the logic circuitry, a calculation as follows may, for example, be made: logic current at each node=(ASIC power−I/O circuit power)/(supply voltage X number of nodes in the resistance model). Using representative values for ASIC power of 20 watts, I/O circuit power of 8 watts, supply voltage of 2.5 volts and a number of nodes in the resistance model equal to 40,000, an average current demand for the logic circuitry at each node could be, for example, 0.12 ma.

For the EM analysis, an average current for the I/O circuits is also calculated using the I/O specifications. In performing the EM analysis, for greater accuracy in the resistance/current model, the current of the logic circuitry of the chip is factored in. The current used by the logic circuitry, which typically includes such elements as inverters, multiplexors, latches and Boolean logic gates, is typically smaller than the currents utilized by the I/O circuits, but affects the EM analysis.

The invention is not limited to calculating DC current values. Typically, the solver includes the capability of calculating time dependent sources for I/O circuits that model differences of slew rates and non-simultaneous switching between circuits.

As discussed above, the calculated maximum currents and average currents are indexed, or logically related, to nodes in the resistance model. As the design of the overall ASIC progresses and actual current demands of the logic circuitry become known, as opposed to a calculated average, these could be indexed to the resistance model for greater accuracy.

Figure 4:
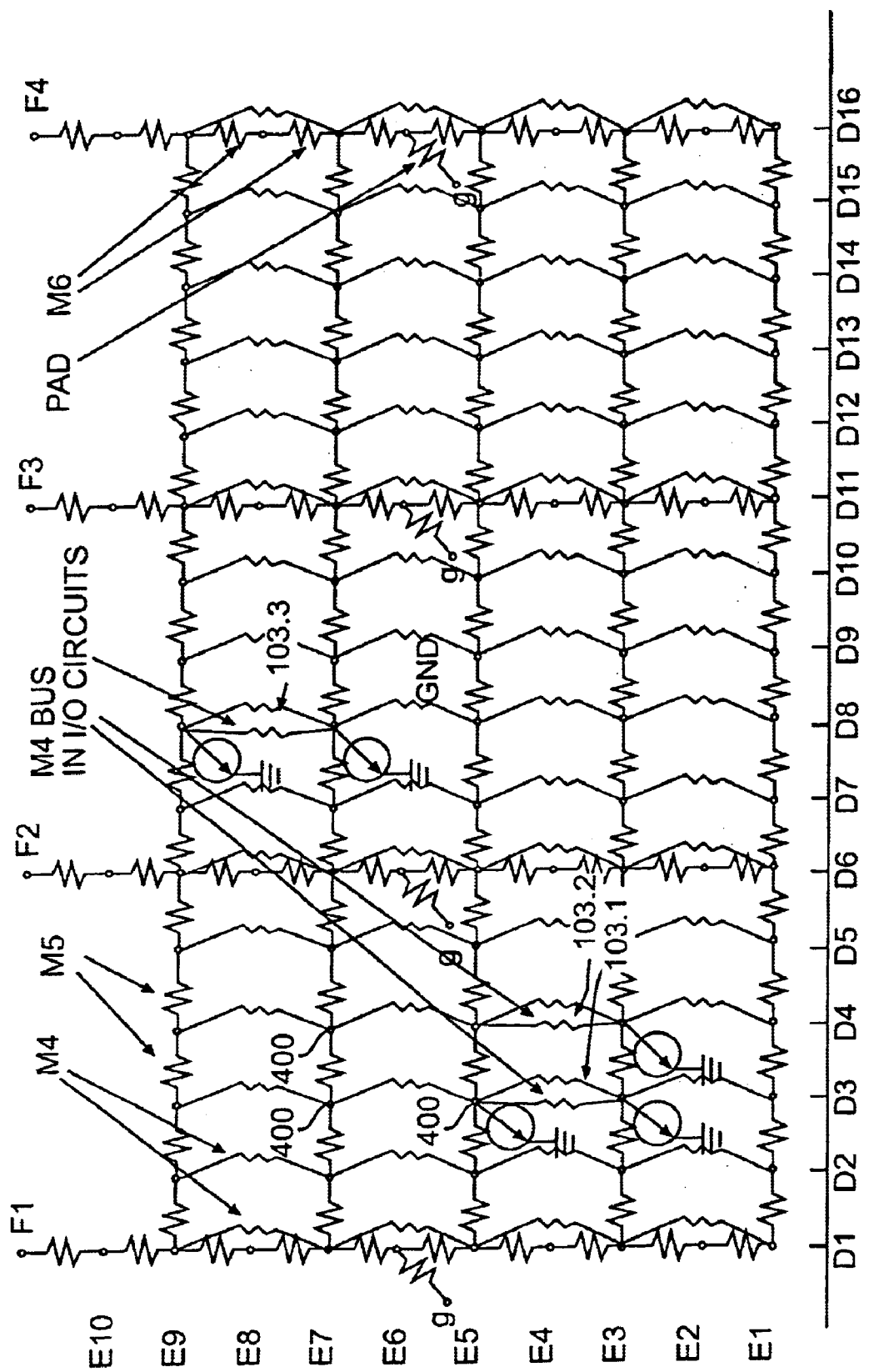
FIG. 4 shows a resistance model corresponding to the power buses and connected I/O circuits of FIG. 3.

FIG. 4 shows an example of a resistance model with I/O circuit currents indexed to nodes that correspond to the portion of the power distribution network shown in FIG. 3. Nodes 400 of the resistance model are shown as points at which discrete resistors, collectively representing the resistivity of the buses of the power distribution network, are connected. The I/O circuits 103.1, 103.2 and 103.3 of FIG. 3 are modeled as current sources and resistances and indexed to the nodes defined in the resistance model, which correspond most closely to the X-Y locations of the I/O circuits in the power distribution network.

Once a resistance model of the power distribution network has been derived and current sources corresponding to the I/O circuits and logic circuitry have been indexed to nodes in the resistance model as shown in FIG. 4 (logic circuitry currents not shown), the resistance model is solved for voltages at the nodes. The model may be solved by any suitable commercially available matrix solver, for example, the Yorktown sparse matrix RLC solver. A more typical resistance model than the model shown in FIG. 4 would comprise tens or hundreds of thousands of nodes, interconnected resistors, current sources and voltage sources.

In an embodiment, the resistance model with indexed currents would be formulated as matrix equations in the form GV=I. The unknowns being solved for are the node voltages V. The conductance matrix G corresponds to a nodal formulation satisfying Kirchoff's current law. The right hand side vector I models the current sources for the I/O circuits and average logic current demand. A typical solver would factor the symmetric G matrix using a Cholesky decomposition LL'. The voltages V would then be computed using forward elimination and back solve.

In constructing the resistance model to be input to the solver, the nodes are named using a naming convention which preserves the X-Y location information during the solving, for example, by naming the nodes after rows and columns of the resistance model. As discussed above the solver would produce files detailing voltages at each node and currents through each element of the resistance model. The files would then be analyzed to identify violations of defined IR and EM limits.

Figure 5:
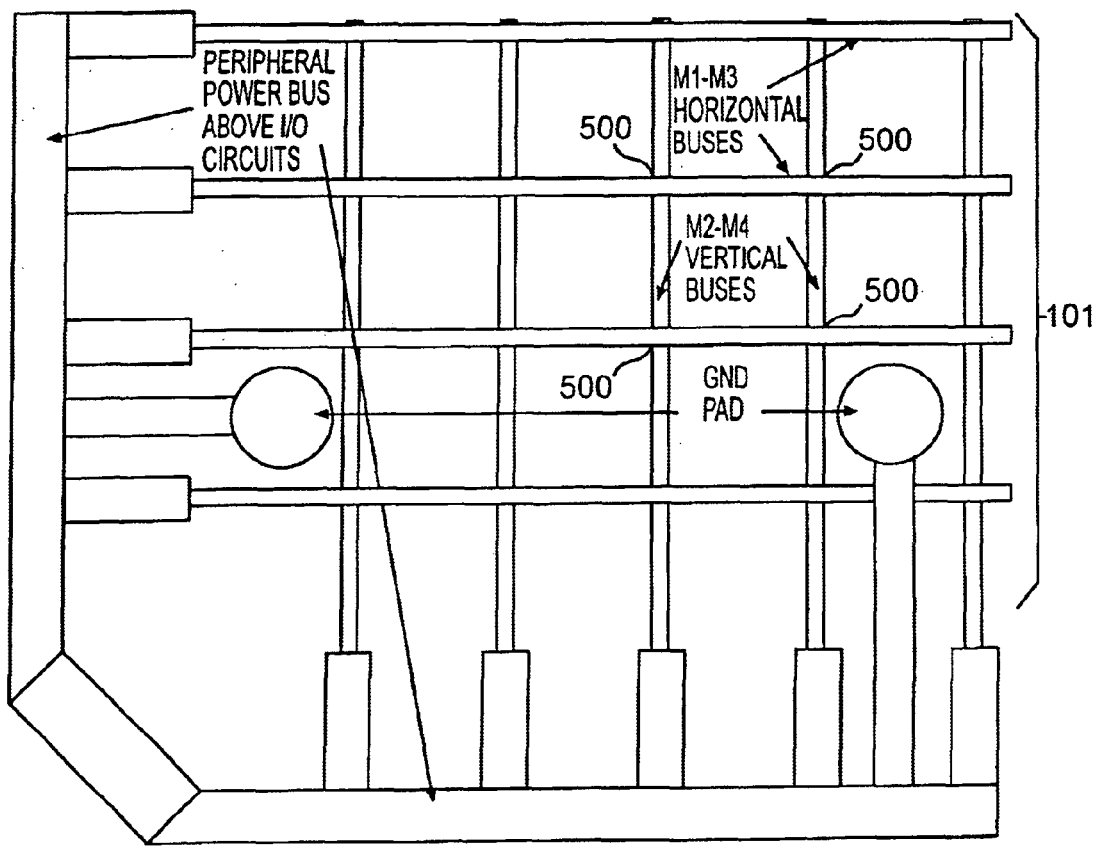
FIG. 5 shows an example of a portion of a peripheral chip layout, with detail of ground bus connections.

FIG. 5 shows the physical layout of a portion of a power distribution network for a peripheral layout as illustrated in FIG. 2. The layout comprises M1–M3 horizontal buses and M2–M4 vertical buses intersecting at nodes 500 within the logic region 101. The buses connect to peripheral power buses which parallel the edges of the die and pass over the I/O circuits. There are occasional GND pads (two are shown) which connect to GND, supplied throughout the module. FIG. 5 shows only the GND buses. There is a similar bus structure for VDD that runs in parallel with the GND buses shown in FIG. 5. The VDD bus structure is not shown for greater clarity.

Figure 6:
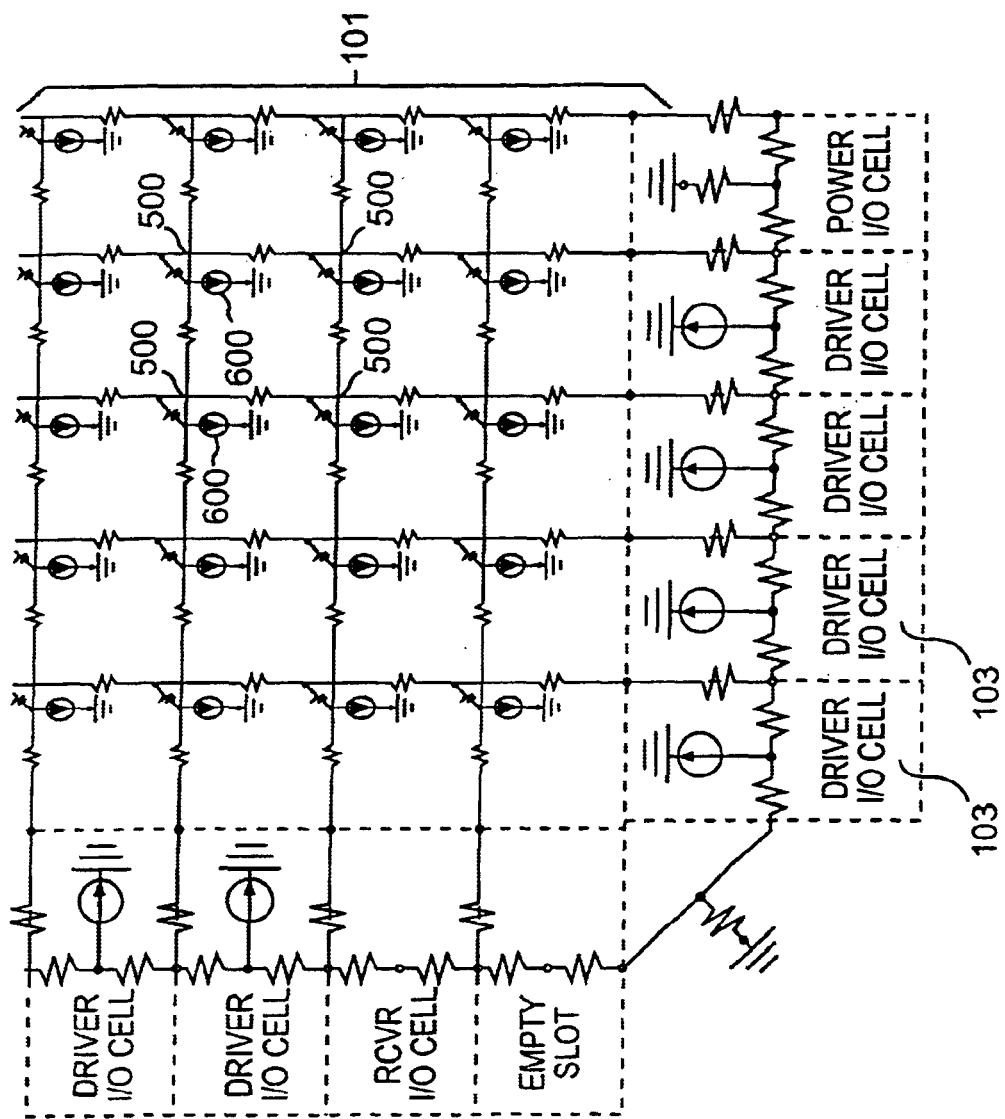
FIG. 6 shows a resistance model corresponding to FIG. 5.

FIG. 6 shows a representation of the resistance model corresponding to the power distribution network of FIG. 5 which would be generated according to the invention, with the currents 600 of the logic circuitry and I/O circuits (cells) 103 indexed to their corresponding nodes. This model is solved by a matrix solver and a report is produced as described above.

Figure 7:
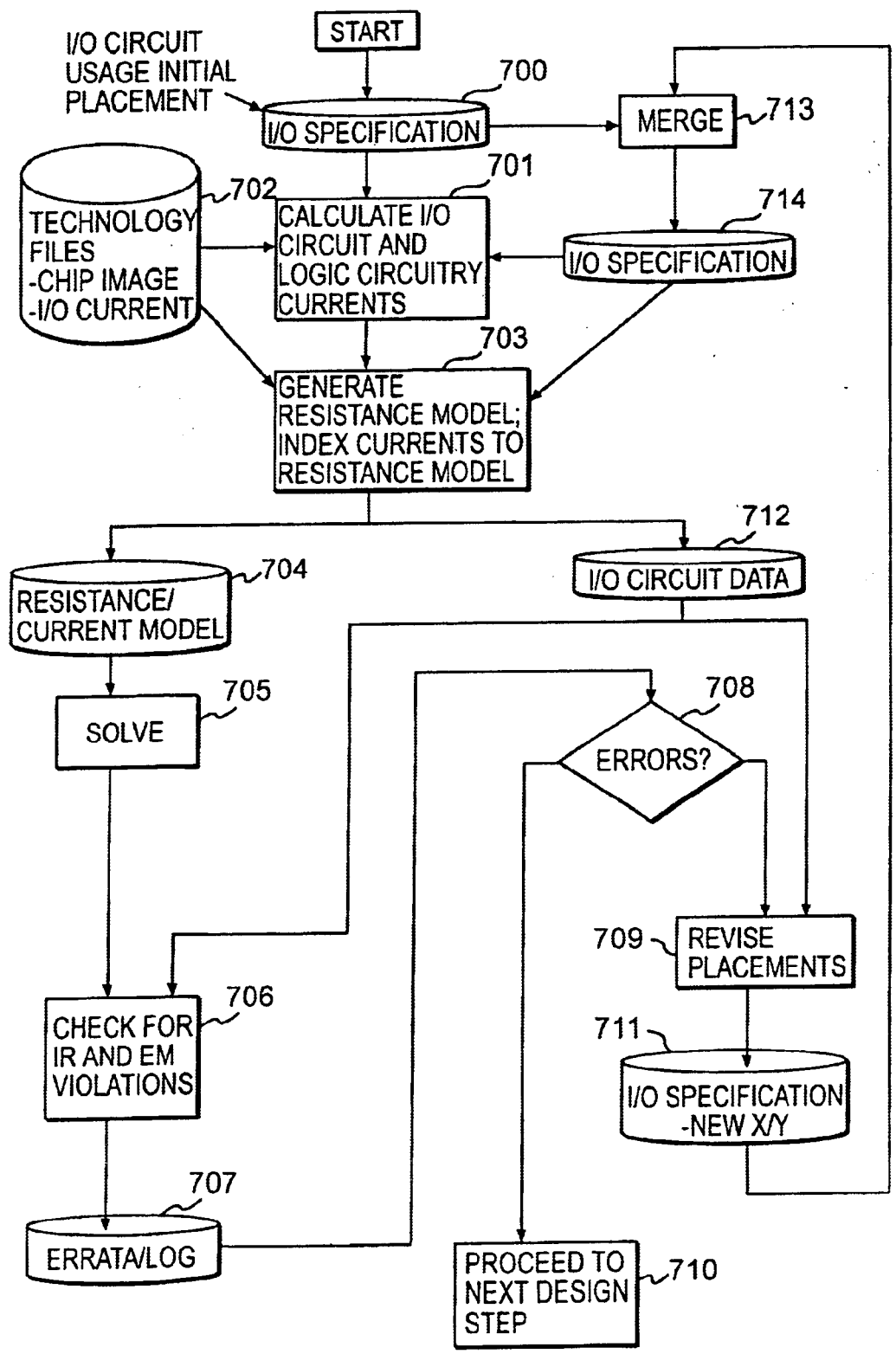
FIG. 7 shows a process flow according to the invention.

FIG. 7 shows a process flow according to an embodiment of the invention. Input file 700 is an I/O specification file containing data describing an initial X-Y placement of the I/O circuits and their connections to the power distribution network of the chip, as illustrated, for example, in FIG. 3. The I/O specification file also contains such information as the impedance of the I/O circuits, which I/O circuits are drivers and which receivers, actual current usage parameters such as duty cycle, switching factor and terminations., and the I/O pads to which the I/O circuits are connected.

Next the maximum and average I/O circuit currents are calculated as shown in block 701 using the information in the I/O specification file. The logic circuitry currents are also calculated. The calculation of the currents may also utilize technology files 702, which includes circuit design information such as capabilities and strength of circuits, and normal usage of currents.

A resistance model is then generated as shown in block 703, and the calculated currents are indexed to the corresponding closest node in the resistance model. An updated I/O circuit specification file 714, resulting from an earlier application of the method, may supply data describing revised X-Y locations of the I/O circuits.

The step of generating the resistance model also utilizes the technology files 702. The technology files would include such data as chip image data. The chip image data would correspond to a type of layout, for example, an area-array type layout or peripheral type layout as shown in FIGS. 1 and 2, and include resistance information for each routing (M1–M6) layer of the chip. The chip image data further includes the locations and voltages of the power buses and pads. The bus information could be expressed as a bus starting location, a bus width, a repeat factor, and an end. As described above, this basic pattern can be used to map out the bus distribution and network across the extent of the chip to construct the resistance model corresponding thereto. Each horizontal and vertical layer of the power distribution network is described in the chip image data.

Block 703 produces the resistance model with indexed currents as shown in output file 704, and may also produce an I/O circuit data file 712 which is used in a step of checking for IR and EM violations and producing an output errata/log file 707, and may be used in a step of revising the placement of the I/O circuits if IR and EM violations are detected. The I/O circuit data arranges data types and related information into a tabular, easily-manipulated format for the convenience of the later processing.

Block 705 illustrates the solving of the resistance/current model. The solved model is checked for IR and EM violations as shown in block 706, and a human-readable errata/log report 707 detailing node voltages, currents and any violations is generated. As shown in block 708, if the check for violations detects any violations, the placement of the I/O circuits may be revised as shown in block 709 and used to generate an updated I/O circuit specification file 711. The updated I/O circuit specification file 711 is merged (block 713) with the initial placement file 700 to produce updated I/O circuit specification file 714. Otherwise, as shown in blocks 710, design may proceed to subsequent stages.

The updated I/O circuit specification 714 may be used, as shown in block 703, to correctly index the revised I/O circuit placements to their corresponding nodes in the resistance model. The revised resistance/current model may be solved and checked again for violations. The foregoing process may be repeated until an error-free design is arrived at.

Figure 8:
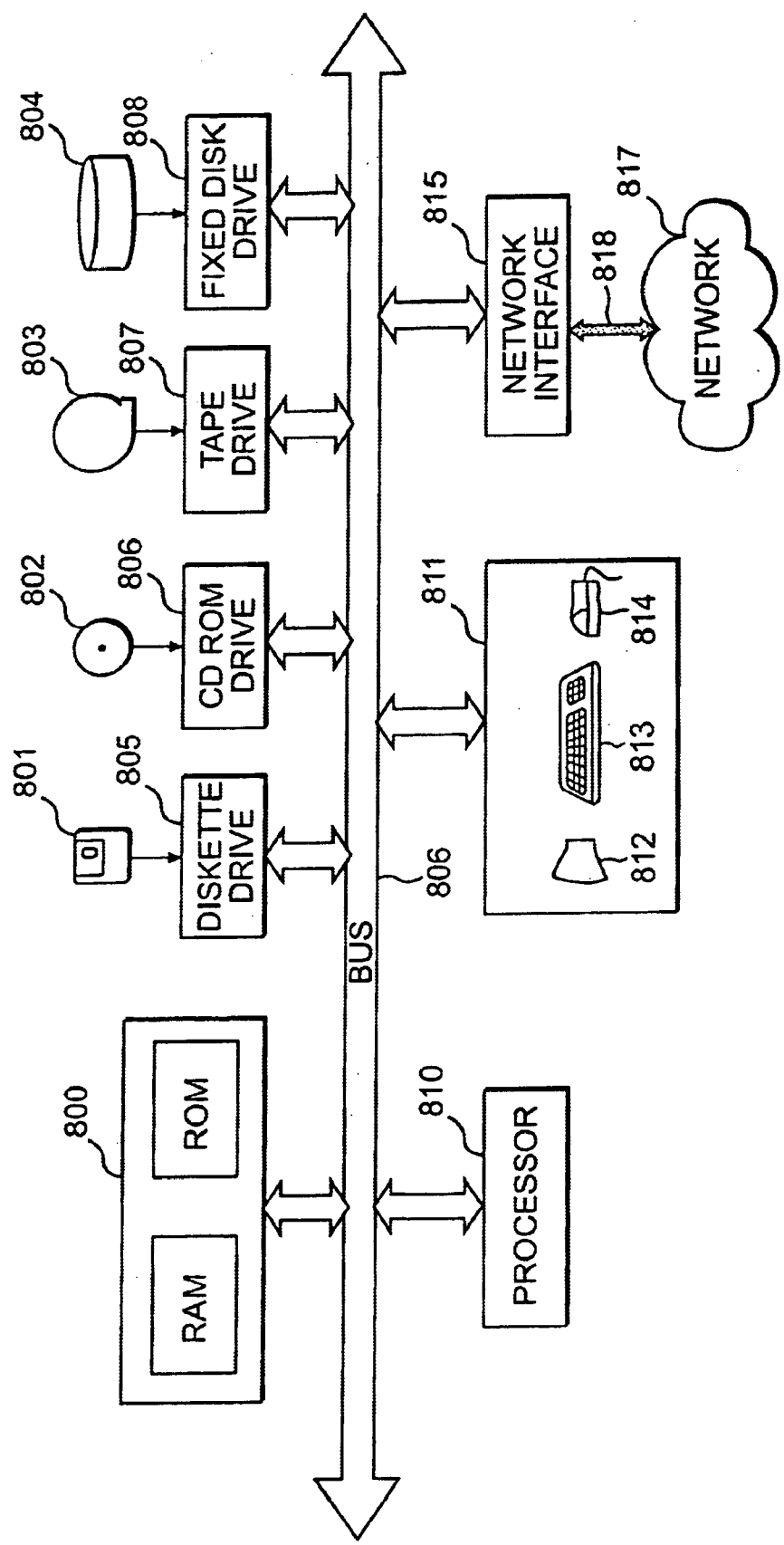
FIG. 8 shows a general purpose computer system for practicing the method of the invention.

FIG. 8 shows a high-level representation of a computer system for implementing a preferred embodiment of the present invention, such as might be realized by a variety of known and commercially available hardware and software elements as embodied, for example, a Unix™ workstation. The system comprises a memory 800 including a ROM and RAM, processor 810 and user interface 811 comprising a video display 812, keyboard 813 and mouse 814. Elements may communicate via system bus 806. The system may further be connected to a network 817 via a network medium 818 and network 815.

A computer program or a collection of programs comprising computer-executable instructions for performing method steps according to the present invention may be stored and transported on computer-usable media such as diskette 801, CD-ROM 802, magnetic tape 803 and fixed disk 804. To perform the steps of the method, the instructions may be retrieved from the computer-usable media 801 through 804 using their respective drives 805 through 808 into memory 800 and executed by a processor 810. The method disclosed hereinabove may find specific implementations in a variety of programming structures and data forms, which are considered to be within the abilities of a programmer of ordinary skill in the art after having reviewed the specification.

The foregoing description of the invention illustrates and describes the present invention. Additionally, the disclosure shows and describes only the preferred embodiments of the invention, but it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention as such, or other, embodiments and with the various modifications required by the particular applications or uses or the invention. Accordingly, the description is not intended to limit the invention to the form disclosed herein. Also, it is intended that the appended claims be construed to include alternative embodiments.

What is claimed is:

1. A method for performing power distribution analysis for I/O circuits in an integrated circuit (IC) design, said I/O circuits having defined placement locations within a power distribution network of said design, comprising the steps of:
   a) calculating maximum and average currents for each of said I/O circuits, and an average logic current demand per node;
   b) creating a resistance model of said power distribution network comprising nodes and resistors corresponding to points on buses of said network and resistivities corresponding to said points;
   c) indexing each of said I/O circuit currents and said average logic current demand per node to the node in said model closest to the corresponding I/O circuit location;
   d) solving the resistance an current source model resulting from step (c) for voltages at the nodes; and
   e) outputting the results.

2. The method of claim 1, further comprising:
   (f) comparing said results against specified voltage drop (IR) and electromigration (EM) limits of said design to identify violations of said limits; and
   (g) changing said I/O circuit placement locations to correct said violations.

3. The method of claim 2, further comprising repeating steps (a)–(g) until step (f) does not identify any violations.

4. The method of claim 1, wherein said design utilizes an area-array type I/O circuit distribution.

5. The method of claim 1, wherein said design utilizes a peripheral type I/O circuit distribution.

6. The method of claim 1, wherein step (d) uses a sparse matrix solver.

7. A method comprising:
   establishing a distribution of I/O circuits in a power distribution network of an IC design;
   generating a resistance model comprising resistivities at nodes corresponding to said network;
   relating currents of said I/O circuits and an average logic current demand per node to nodes in said resistance model;
   solving for voltages at said nodes in terms of said resistivities, I/O circuit currents and average logic current demand per node;
   identifying ones of said voltages not in compliance with IR and EM limits of said design and
   re-arranging said distribution to bring said identified voltages into compliance.

8. The method of claim 7, further comprising selecting a granularity of said resistance model for a desired accuracy of said model.

9. The method of claim 7, further comprising using lumped resistance values to represent routing layers of said design in said model.

10. The method of claim 7, wherein said solving step comprises:
  formulating a conductance matrix from said resistance model and a current matrix from said UO circuit currents and average logic current demand per node;
  calculating voltages at said nodes using relationships between said conductance matrix and said current matrix established by said relating step.

11. The method of claim 7, wherein said identifying step comprises:
  comparing said voltages against a design rule specifying an allowable variation of said voltages as a percentage of a supply voltage.

12. The method of claim 7, wherein said step of generating a resistance model comprises:
  repeating a bus pattern by a repeat factor, said bus pattern including a bus staring location, a bus width and a bus end.

13. A computer-usable medium storing computer-executable instructions, said instructions when executed implementing a process comprising:
  from a power distribution network for an IC design, generating a resistance model comprising resistivities at nodes corresponding to said network;
  relating currents of I/O circuits connected to said network, and an average logic current demand per node, to nodes in said resistance model;
  solving for voltages at said nodes in terms of said resistivities, I/O circuit currents and average logic current demand per node; and
  outputting the results, said results identifying ones of said voltages not in compliance with IR and EM limits of said design.

14. A program storage device readable by a machine, tangibly embodying a program of instructions executable by the machine to perform method steps of performing power distribution analysis for I/O circuits in an integrated circuit (IC) design, said I/O circuits having defined placement locations within a power distribution network of said design, comprising the steps of:
  a) calculating maximum and average currents for each of said I/O circuits, and an average logic current demand per node;
  b) creating a resistance model of said power distribution outwork comprising nodes and resistors corresponding to points on buses of said network and resistivities corresponding to said points;
  c) indexing each of said I/O circuit currents and said average logic current demand per node to the node in said model closest to the corresponding I/O circuit location;
  d) solving the resistance and current source model resulting from step (c) for voltages at the nodes; and
  e) outputting the results.

15. A computer system comprising:
  a memory containing computer-executable instructions;
  a processor coupled to said memory for executing said instructions, said instructions when executed performing a process comprising:
  from a power distribution nets for an IC design, generating a resistance model comprising resistivities at nodes corresponding to said network;
  relating currents of I/O circuits connected to said network, and an average logic current demand per node, to nodes in said resistance model;
  solving for voltages at said nodes in terms of said resistivities, I/O circuit currents and average logic current demand per node; and
  outputting the results, said results identifying ones of said voltages not in compliance with IR and EM limits of said design.

* * * * *